US007045174B1

(12) United States Patent
Blum et al.

(10) Patent No.: US 7,045,174 B1
(45) Date of Patent: *May 16, 2006

(54) METHOD AND DEVICE FOR INSULATING ELECTRO-TECHNICAL COMPONENTS

(75) Inventors: Rainer Blum, Ludwigshafen (DE); Manfred Eichhorst, Oststeinbek (DE); Gunther Hegemann, Hamburg (DE); Klaus-Wilhelm Lienert, Hamburg (DE)

(73) Assignee: Altana Electrical Insulation GmbH, Wesel (DE)

( * ) Notice: Subject to any disclaimer, the term of this patent is extended or adjusted under 35 U.S.C. 154(b) by 0 days.

This patent is subject to a terminal disclaimer.

(21) Appl. No.: 10/069,061

(22) PCT Filed: Jul. 31, 2000

(86) PCT No.: PCT/EP00/07380

§ 371 (c)(1),
(2), (4) Date: Sep. 4, 2002

(87) PCT Pub. No.: WO01/15179

PCT Pub. Date: Mar. 1, 2001

(30) Foreign Application Priority Data

Aug. 21, 1999 (DE) ................................ 199 39 760

(51) Int. Cl.
*B05D 3/06* (2006.01)
*B05D 5/12* (2006.01)
*C08F 2/46* (2006.01)
*C08F 2/48* (2006.01)
*C08J 7/18* (2006.01)

(52) U.S. Cl. ...................... 427/512; 427/513; 427/521; 427/116; 427/120; 427/493

(58) Field of Classification Search ................ 427/508, 427/512, 513, 521, 116, 117, 120; 118/50.1, 118/641, 642, 643
See application file for complete search history.

(56) References Cited

U.S. PATENT DOCUMENTS

| 4,234,624 | A | * | 11/1980 | Linderoth et al. | ........... | 427/521 |
| 5,705,232 | A | * | 1/1998 | Hwang et al. | .............. | 427/512 |
| 6,090,236 | A | * | 7/2000 | Nohr et al. | .................. | 427/513 |
| 6,146,717 | A | * | 11/2000 | Lienert et al. | ............... | 427/512 |
| 6,274,638 | B1 | * | 8/2001 | Yonemura et al. | ............ | 521/64 |
| 6,277,897 | B1 | * | 8/2001 | Nohr et al. | ................. | 427/511 |
| 6,759,080 | B1 | * | 7/2004 | Thunhorst et al. | ......... | 521/50.5 |
| 6,790,485 | B1 | * | 9/2004 | Baumbach et al. | ......... | 427/508 |
| 6,844,029 | B1 | * | 1/2005 | Okada et al. | ................ | 427/492 |
| 6,852,771 | B1 | * | 2/2005 | Balch et al. | ................. | 522/135 |
| 6,858,261 | B1 | * | 2/2005 | Bar et al. | .................... | 427/542 |

FOREIGN PATENT DOCUMENTS

| DE | 19648133 | | 5/1985 |
| EP | 0065147 | | 11/1982 |
| JP | 10-182767 A | * | 7/1998 |
| JP | 10-182768 A | * | 7/1998 |
| JP | 2001-322182 A | * | 11/2001 |
| WO | 9967794 | | 12/1999 |

OTHER PUBLICATIONS

Pappas, S.P, ed. *UV Curing: Science and Technology*; technology Marketing Corp.; Stamford, Conn., except p. 97-98, 1978, no month.*

* cited by examiner

*Primary Examiner*—Marianne Padgett
(74) *Attorney, Agent, or Firm*—Friedrich Kueffner

(57) ABSTRACT

The method for hardening electro-insulating materials is characterised by the utilization and/or co-utilization of near-infrared radiation (NIR) having a wavelength of 500 nm to 1400 nm. NIR also enables very fast hardening of the component surface even with pure thermally hardenable impregnating material and further provides good hardening of thick layers located deep inside said layers. Combined hardening, for example, NIR and UV light, is also possible.

8 Claims, No Drawings

METHOD AND DEVICE FOR INSULATING ELECTRO-TECHNICAL COMPONENTS

The present invention relates to a process for insulating electrical components by applying a coat of polymerizable casting and impregnating composition and/or lacquer in flowable form to the surface of the components and then curing it using high-energy radiation. The invention further relates to an apparatus for implementing the said process.

For electrical insulation, mechanical stabilization and heat distribution in electrical components, so-called casting and impregnating compositions (CICs) are used in all but a few special cases. These compositions generally comprise liquid or heat-liquefiable resins which may be cured (polymerized) by means of heat and/or UV light.

In order to achieve rapid cycle times in the insulation of components with the said compositions, the processes becoming established are increasingly those in which heat is generated very rapidly by applying current to the windings of the components and the CICs are cured. A problem in this case, however, is that of curing at areas which are inadequately heated by the heat flux from the winding and so may be inadequately cured.

For these cases, increasing importance is being attached to processes wherein, in addition to the heat, UV light is used to cure those areas of the components which are heated inadequately or too slowly by the heat flux from the windings. Economic problems result in this case from the need to modify the CICs chemically to make them UV-sensitive, and from the need to use expensive photoinitiators as well. Moreover, a technical problem lies in local UV inhibition by auxiliaries which are used in the assembly of the components or present in individual constituent parts (e.g. the insulations of different connecting cables) of the components. As a result of these problems, there may be local instances of tacky surfaces.

DE-A-40 22 235 and DD-A-295 056 propose reducing the evaporation losses of customary impregnating compositions containing high fractions of monomers such as styrene by first curing the surfaces with UV rays and then curing the interior of the components by supplying heat.

Furthermore, EP-A-0 643 467 discloses using customary impregnating compositions containing high fractions of monomers such as styrene and, in order to improve the distribution of the impregnating composition in the component, carrying out coil heating as early as during impregnation in order to pre-gel and fix the impregnating composition and to obtain thermal curing. Simultaneously with, or else following, the thermal curing on the windings, those areas of the components which have not been reached by the heating of the winding are to be cured with high-energy radiation, preferably UV radiation.

DE-A-196 00 149 describes special CICs which are curable without monomers. Curing means cited are heat and/or actinic radiation in the form of UV light.

In DE 196 48 132 A1, DE 196 48 133 A1 and DE 196 48 134 A1, as well, various advantageous combinations of CICs with curing by heat and/or actinic radiation in the form of UV light are described.

The object of the present invention was to provide a more cost-effective process for insulating electrical components and, furthermore, one which is not subject to any inhibition by chemicals originating from the component.

This object is achieved by means of a process for insulating electrical components by conventionally applying a coat of polymerizable casting and impregnating composition and/or lacquer in flowable form to the surface of the components and then curing it with the aid of high-energy radiation. The process is characterized in that the high-energy radiation consists entirely of or comprises fractions of near-infrared (NIR) radiation.

The components which may be insulated by the process include transformers or other components with windings, and also conducting wires. Whereas with components of relatively complex shape impregnation is necessary for complete wetting of the surfaces to be insulated, coating is generally sufficient in the case of electrical conducting wires. In addition to the NIR radiation used in accordance with the invention, it is also possible to use other common energy sources for the curing of the CICs or of the lacquer, e.g. hot gases, UV light or electron beams. The action of the NIR radiation may, accordingly, be limited to initial curing of the coating.

By means of the application of NIR radiation it is now possible in all cases where UV curing has been used to date to use conventional, purely thermally curable CICs. This signifies a considerable reduction in costs. Moreover, there are no UV inhibitions to be concerned about, and the substances may be handled under daylight without the risk of premature polymerization. Moreover, a combination of conventional heating, e.g. with circulating air, joule heat and IR radiation (with a typical wavelength of up to $10^6$ nm), with the heating of the invention comprising NIR radiation and with additional curing by UV light may be rational for specific purposes. The selection of a rational combination and sequence is possible for the person skilled in the art in each individual case on the basis of technical and economic considerations.

The advantage of NIR radiation in comparison to medium- and long-wave IR radiation is that in the context of the resin compositions to be cured it penetrates directly to the coat thickness customary with electrical insulating materials, whereas long-wave IR radiation is absorbed at the surface and heating of the lower-lying regions is possible only by means of heat flux, which necessitates long heating times and carries the risk of overheating at the surface.

A further advantage of the process of the invention is that it may be implemented on existing lines modified only slightly by the downstream insertion of an NIR lamp. Adaptation of the line is possible essentially just by altering the control parameters and the process sequence.

Another key advantage of the invention, in addition to the economic factors associated with the saving in terms of photoinitiators, the simplified synthesis of the resins and the shorter cycle time, is the capacity for very rapid curing even of temperature-sensitive areas of the components without damage, since the NIR radiation heats the resin coats to high temperatures very rapidly and curing is at an end before the underlying areas become too hot.

The NIR radiation used in accordance with the invention has a wavelength of preferably from 500 nm to 1400 nm, with particular preference from 750 nm to 1100 nm. NIR radiation within these wavelength ranges can on the one hand be produced relatively simply and in readily controllable form and on the other hand covers the optimum range for the curing of the CICs and lacquers.

In order to permit penetration of the NIR radiation into the resin compositions or lacquer coats, the intensity maximum of the NIR sources is advantageously situated within a wavelength range wherein the casting and impregnating composition or the wire lacquer is in part transparent to NIR light, i.e., its absorbance at this wavelength is between 20 and 80%, preferably between 40 and 70%.

Furthermore, it is advantageous to focus and direct the NIR radiation using optical devices in such a way that a temperature distribution adapted to the curing characteristics of the substances is achieved on the components or wires to be cured. The presence of such a distribution may be checked using suitable measuring devices or by means of model calculations.

In the context of the process of the invention, the coating may additionally be cured by means of thermal heating with heated gases (circulating air), by means of UV light and/or by means of electron beams. Through the additional use of NIR radiation it is then possible to control the course of heating more closely.

Components for impregnation are preferably impregnated at ambient temperature or in a preheated state or are heated during impregnation. This makes the CICs more liquid and so better able to penetrate into confined areas of the components.

Moreover, following impregnation and before curing, impregnated components are preferably heated to the stage of partial gelling. The amount of gelled impregnating composition may be controlled by the rate, extent and duration of heating. The partial gelling causes the applied coating compositions to solidify to an extent such that in the course of subsequent processing they do not simply run off from the component to leave unprotected areas. In the case of components with a winding, heating can be effected by the flow of electrical current through the winding.

Following the partial gelling, the components are preferably treated with NIR radiation and then cured to completion thermally and/or with UV light.

Furthermore, prior to, simultaneously with or following thermal curing, the components may be treated with NIR radiation and with further high-energy radiation, preferably UV radiation. The said combinations of NIR radiation with conventional curing methods have an advantageous effect on the curing process and thus on the properties of the resulting insulation.

The impregnation of the components may take place by immersion, flooding, vacuum impregnation, vacuum pressure impregnation or trickling.

In the case of components having electrically conducting windings, the windings of the impregnated components are advantageously heated in the impregnating composition by applying current to an extent such that a desired amount of impregnating composition is gelling and fixed, after this gelling component being removed from the impregnating composition, ungelled impregnating composition running off and, if desired, being cooled and recycled, and the components being subsequently cured. The process sequence described has been found to be particularly favorable for components having windings, such as transformers, for example.

CICs suitable for the process are described, for example, in DE-A-195 42 564, DE-A-196 00 149, DE-A-197 57 227 and DE 196 48 133 A1. Unless an additionally UV curing is desired, it is economically and technically sensible to forego the use of photoinitiators.

Substances with which the process of the invention may be implemented are in particular the well-known impregnating compositions based on unsaturated polyester resins which become free-radically copolymerizable by means of preparation with unsaturated monomers as reactive diluents. Judicious polyesters for selection are known to the person skilled in the art, as are imide- or amide-modified polyesters, which have particularly advantageous thermal and mechanical properties. The judicious reactive diluents for selection are also known; they comprise in particular styrene, a-methylstyrene, vinyltoluene, allyl esters, vinyl esters, vinyl ethers and/or (meth)acrylates. These polyester resin preparations may be cured thermally and/or with high-energy radiation, preferably UV light, as desired, with initiators or catalysts or catalyst mixtures which are likewise known to the person skilled in the art.

Further substances with which the process of the invention may be implemented are free-radically polymerizable monomeric, oligomeric and/or polymeric substances which are also radiation-curable, especially UV-light curable. These substances and combinations of substances are also well known to the person skilled in the art. They comprise in particular substances and/or mixtures of substances containing allylic, vinylic or (meth)acrylic unsaturation. Suitable examples include polyepoxy (meth) acrylates, polyurethane (meth) acrylates and/or polyester (meth)acrylates.

The preparations are in some cases thermally polymerizable directly; for optimum thermal curing at ideally low temperatures, however, it is preferred and judicious to add free-radical initiators. In addition, UV initiators are generally added for rapid UV curing. The additional use of stabilizers for improving the storage stability is also known state of the art.

Furthermore, it is also possible to use substances polymerizable ionically; that is, in particular, monomeric and/or oligomeric epoxides in conjunction with thermally and UV-activatable initiators. Substances of this kind are also known state of the art.

The process of the invention is particularly advantageous in combination with the monomerlessly curable substances of DE 195 42 564, DE 196 00 149, DE 197 57 227 and DE 196 48 133 A1, since these substances are not readily ignitable on curing. However, curing of customary CICs containing high fractions of monomers such as styrene, acrylates and the like with NIR is also possible and technically implementable if it is ensured—for example, by reducing the power and/or cycling the NIR emitters—that the ignition temperature of the CICs, which is far above the curing temperature, is not exceeded. It is also possible to ensure by means of local supply of inert gas or fresh air that no ignitable or explosive gas mixtures are formed.

The invention additionally provides an apparatus for insulating electrical components, the said apparatus comprising a coating means for applying a coat of polymerizable casting and impregnating composition and/or lacquer to the surface of the components and a heating means for heating the components. The apparatus is characterized in that the heating means comprises at least one near-infrared (NIR) radiation source. Using the apparatus, therefore, the process of the invention as elucidated above may be implemented, with the explained advantages resulting.

Suitable NIR radiation sources are commercially available emitters which emit a high proportion of their radiation within the preferred wavelength range. The emitters concerned are generally halogen lamps with a high coiled-filament temperature (e.g. halogen lamps from USHIO Inc., Tokyo). The advantage of NIR radiation in comparison to medium- and long-wave IR emitters is the ability to control the radiative intensity very rapidly without removing the emission maximum from the region of the NIR wavelength. Moreover, in the resin compositions to be cured, the NIR rays penetrate directly to the customary coat thickness of electrical insulating materials, whereas long-wave IR radiation is absorbed at the surface and the heating of the lower-lying regions is possible only by means of heat flux, which necessitates long heating times and carries the risk of overheating at the surface.

The heating means preferably comprises an electrical regulator of the NIR radiation sources, in order to adjust the wavelength and/or the radiative energy acting on the substrates. Furthermore, the apparatus may include optical filter means in order to adjust the wavelength and/or the radiative energy acting on the substrates.

EXAMPLES

In the text below, the invention is illustrated with the aid of experimental examples.

The experiments were conducted in a laboratory unit. The unit has an open-topped vessel which holds the CICs and can be sealed with a lid, which also acts as a drip plate. Mounted above the vessel is a holder for the components to be impregnated. The holder can be lowered by means of an electric motor, so that the components may be immersed uniformly and at the desired rate into the CIC. The windings of the components may be heated to a desired temperature with a regulated current.

The experiments were conducted with the stator of a small industrial motor having a diameter of approximately 15 cm. The windings are guided in the winding heads by means of auxiliary frames made from thermoplastic; also, there are connecting wires insulated with plastics in different colors. The CIC used was the monomer-free resin Dobeckan MF 8001-UV from Schenectady-Beck, Hamburg. Dobeckan MF 8001-UV is a monomer free, one-component impregnating resin based on an especially modified unsaturated polyester resin. The resin comprises photoinitiators.

Example 1 (E1)

Component and impregnating composition are at room temperature of 26° C. The components is immersed at 135 mm/min; after 1 min in the impregnating composition, there is no further escape of air from the component. The winding is then heated to 125° C. and held there for 4 minutes. It is then removed from the immersion bath, left above the bath to drip dry for 10 min, heated to 180° C. and held there for 20 min. In the course of this heating, temperatures of from 90 to 120° C. are reached at the surface of the component.

After cooling, the surface of the component, with the exception of the winding wires, is moderately to highly tacky; on the thermoplastic parts and the connection cables, the resin acts cured little or not at all. The component becomes usable only after subsequent curing in an oven at 130° C. for 4 hours, although the winding stack has cured well even before this oven curing. The oven temperature must not exceed approximately 130° C., so as to avoid deformation of the thermoplastic parts.

Example 2 (E2)

The procedure of Example 1 is repeated except that after thermal curing at 180° C. in 20 min irradiation is carried out from above and below for 10 min with in each case 2 UV mercury medium-pressure rays having a power consumption of 500 W each for 10 minutes. During this irradiation the heating of the winding is retained; temperatures of 100–140° C. are reached on the surface of the component. The component has cured well in the windings and on the stack of sheets; the thermoplastic parts and the connection cables are still slightly tacky and require subsequent curing in an oven at 130° C. for about 1 hour in order to detackify them.

Example 3 (E3)

The CIC is the same (Dobeckan MF 8001) as in the previous examples, in a special formulation without photoinitiator. The procedure of Example 1 is repeated but the thermal curing with winding heating is reduced to 8 min at 180° C. and then irradiation is carried out from above and below with in each case 2 regulated NIR sources having an emission maximum between 750 nm and 1300 nm and a power consumption of in each case approximately 2000 W, for 40 s. The emitters are regulated by way of thyristors which obtain a regulating signal from sensors which measure the surface temperature of the component. The preset switching temperature was 170° C. The winding heating is retained; temperatures of 170–180° C. are reached at the surface of the component.

On the surface, including at the connection wires and at the thermoplastic part, the component is completely tack-free and has cured well in the interior. The thermoplastic parts exhibit no deformation or other damage.

Example 4 (E4)

The procedure of Example 3 was repeated except that instead of the NIR emitters long-wave IR emitters having an emission maximum at approximately 7000 nm (porcelain dark emitters) and an output of likewise 2000 W were mounted. These emitters require a heat-up time of approximately 15 minutes to reach their output. When these emitters were preheated and then positioned over the component, instances of surface carbonization of the impregnating resins occurred after approximately 20 s without curing of lower-lying areas. When the output of the emitters was reduced by means of a voltage regulator, so that instances of carbonization no longer occurred and surface temperatures of approximately 200° C. were reached, sufficient curing in the lower-lying areas of the impregnating composition was achieved only after approximately 30 minutes.

The examples show the advantages, in accordance with the invention, of the use of NIR light in the curing of electrical insulating compositions through the savings in terms of photoinitiator, cycle time and energy. NIR radiation permits very rapid curing of the component surface with effective curing even of thick coats, deep into these coats, using purely thermally curable impregnating compositions. As a result, the known cost-effective, purely thermally curable impregnating compositions can be used for rapid cycle processes without the need to develop, for example, UV-curable impregnating compositions or to use expensive photoinitiators.

What is claimed is:

1. A process for insulating electrical components comprising the steps of:
    (a) providing one or more electrical components selected from the group consisting of transformers, components with windings, and conducting wires;
    (b) applying a coat of polymerizable casting and impregnating composition and/or lacquer in flowable form to the surface of the components to impregnate the coat onto the components, wherein the impregnation step is achieved through immersion, flooding, vacuum impregnation, vacuum pressure impregnation or trickling; and (c) curing the coated components to completion using near-infrared (NIR) radiation, said NIR radiation having a wavelength of from 500 nm to 1400 nm.

2. The process as in claim 1, wherein the NIR radiation has a wavelength of from 750 nm to 11 nm.

3. The process as in claim 1, wherein the intensity maximum of the NIR radiation is situated within a wavelength range wherein the casting and impregnating composition of lacquer has an absorbance of between 20 and 80%.

4. The process as in claim 1, wherein the NIR radiation is focused so that within the coat to be cured a temperature distribution adapted to the curing characteristics of said composition and/or lacquer is achieved.

5. The process as in claim 1, wherein the coat is additionally cured by means of thermal heating with heated gases, by means of UV light and/or by means of electron beams.

6. The process as in claim 1, wherein the components are impregnated at ambient temperature or in a preheated state or are heated during impregnation.

7. The process as in claim 6, wherein, following impregnation and before curing, the components are heated to the stage of partial gelling.

8. The process as in claim 1, wherein electrically conducting windings of the impregnated components are heated in the impregnating composition by applying current to an extent such that the desired amount of impregnation composition is gelled and fixed, in that after this gelling the component is removed from the impregnating composition, ungelled impregnating composition runs off and, if desired, is cooled and recycled, and in that the components are subsequently cured.

* * * * *